United States Patent [19]

Okuno et al.

[11] Patent Number: 4,800,137
[45] Date of Patent: Jan. 24, 1989

[54] COMPOSITE LAYER ALUMINUM NITRIDE BASE SINTERED BODY

[75] Inventors: Akiyasu Okuno, Kani; Masakazu Watanabe, Nagoya; Kazuhiko Ikoma, Komaki, all of Japan

[73] Assignee: NGK Spark Plug Co., Ltd., Nagoya, Japan

[21] Appl. No.: 50,388

[22] Filed: May 18, 1987

Related U.S. Application Data

[62] Division of Ser. No. 869,792, Jun. 2, 1986, Pat. No. 4,695,517.

[30] Foreign Application Priority Data

| May 13, 1985 | [JP] | Japan | 60-119174 |
| Jun. 13, 1985 | [JP] | Japan | 60-129023 |
| Jun. 17, 1985 | [JP] | Japan | 60-131570 |

[51] Int. Cl.$^4$ ............ B32B 31/26; C04B 35/58; F27D 7/06
[52] U.S. Cl. ............ 428/698; 156/89; 427/419.7; 501/96; 501/100; 501/119; 501/153
[58] Field of Search .......... 156/89; 428/698; 501/96, 100, 119, 153; 427/419.7

[56] References Cited

U.S. PATENT DOCUMENTS

| 2,839,413 | 6/1958 | Taylor | 156/89 |
| 4,435,513 | 3/1984 | Komeya et al. | 501/96 |
| 4,540,673 | 9/1985 | Takeda et al. | 428/698 |
| 4,578,232 | 3/1986 | Huseby et al. | 428/698 |
| 4,585,706 | 4/1986 | Takeda et al. | 428/698 |
| 4,591,537 | 5/1986 | Aldinger et al. | 428/698 |
| 4,666,873 | 5/1987 | Morris et al. | 501/96 |

FOREIGN PATENT DOCUMENTS

| 0111922 | 6/1984 | European Pat. Off. | 428/698 |
| 0101889 | 6/1984 | Japan | 428/698 |
| 0348532 | 8/1972 | U.S.S.R. | 501/96 |

Primary Examiner—Caleb Weston
Attorney, Agent, or Firm—Wegner & Bretschneider

[57] ABSTRACT

A composite layer aluminum nitride-base sintered body has on at least one surface of AlN-base sintered body having a first layer and a second layer. The first layer is 100 parts by weight of at least one component selected from the group consisting of W, Mo, borides thereof and carbides thereof as a first component (s), and 0.1–50 parts by weight of AlN second component. The second layer has at least one component selected from the group consisting of W, Mo, borides thereof and carbides thereof. The thickness of said first layer is 0.5–40 μm, and the sum of thickness of the first and second layers is 1–50 μm. The AlN may also include sintering aids of oxides of rare earth metal and alkaline earth metals. Hydrides and oxides of Ti, Zr, Nb, V and Mn may be included in the first layer composition.

16 Claims, 2 Drawing Sheets

COMPOSITE LAYER ALUMINUM NITRIDE BASE SINTERED BODY

This application is a divisional of Ser. No. 869,792, filed June 2, 1986 now Pat. No. 4,695,517.

BACKGROUND OF THE INVENTION

The present invention relates to an aluminum nitride sintered body for use as an insulating material having a high thermal conductivity in an insulating substrate heat sink, laser tube and the like. More particularly, it relates to a composite layer aluminum nitride-base sintered body which has an improved surface electric conductivity and/or an improved wettability to metal specifically a base plate or substrate.

In recent years, the requirements for minimizing electronic instruments and improving their functions have increased prominently. As a result, semiconductors are rapidly developing towards improvements in integration density, multifunctionization, high speed, high output and high responsibility. wherein more and more heat is generated by the semiconductor. Therefore, a base plate or substrate with higher heat-dissipation (or radiation) ability is needed instead of covnentional $Al_2O_3$ base plates or substrates.

Various heat engines, industrial instruments and the like are developing towards a high output, too. Accordingly materials with higher heat-dissipation are generally required nowadays.

As the materials for substrates with high heat-dissipation ability, i.e., as the materials with high thermal conductivity, there are counted, for example, diamond, CBN (cubic boron nitride), SiC (silicon carbide), BeO (beryllia), AlN (aluminum nitride), Si, and the like. However, these materials have following drawbacks. Diamond and CBN have a difficulty in manufacturing a product of such a size usable as a substrate and are very expensive. SiC cannot be used instead of an $Al_2O_3$ substrate since SiC is semiconductive and inferior in electric characteristics such as electric insulating ability, dielectric constant and the like, compared with $Al_2O_3$. BeO, in spite of its excellent electric characteristics, has a difficulty in its stable supply since it is not manufactured in Japan thus depends on the immport from foreign contries, due to the poisonous powder occurring in the compacting process, abrasive machining process and the like.

Si has inferior electric characteristics and a low mechanical strength, and hence has a limited use as a material for the substrate. Although AlN has advantages that it is excellent in electric characteristics, for example, high insulating ability, high dielectric brake down strength, low dielectric constant, etc. and that it can be sintered under atmospheric pressure, it has a drawback that the metal layer cannnot be formed on a required surface, and that a bonding strength to metal is insufficient. Thus employing aluminum nitride, therefore, multilayer substrates, laser tubes and the like have never been developed.

That is, AlN cannot be easily metallized because of a low wettability to metal, and hence it has a difficulty in use as a substrate.

For example, Japanese Patent Kokai Publication Nos. 50-75208 and 59-40404 disclose metallization after oxidixing of the surface of an AlN base plate, and Japanese Patent Kokai Publication No. 53-102310 discloses formation of a metal oxide layer on the surface of an AlN base plate before metallization.

The above-disclosed techniques, in spite of the possibility of the metallization on the AlN sintered product, have a drawback that they cannot provide sufficient adhesion or bonding strength. Further, these conventional methods have a drawback that they cannot be employed in a simultaneous sintering (so-called cofiring) for production of a multilayer structure substrate as a substrate-material.

SUMMARY OF THE INVENTION

It is a primary object of the present invention to provide a composite layer AlN-base sintered body which has a high thermal conductivity and excellent electric characteristics.

It is another object of the present invention to provide a composite layer AlN-base sintered body which has an excellent wettability with metal.

It is a further object of the present invention to provide an AlN-base substrate which has a high thermal conductivity, a low sirface electric resistance and a high insulating property in the base body.

It is a still further object of the present invention to provide a composite layer AlN-base sintered body which is useful as a multilayer AlN-base substrate laminated by interposing a conductive or semiconductive layer.

It is still a further object of the present invention to provide an AlN-base substrate which can be made to a multilayer substrate comprising metallization like laminated circuit boards or substrates therefor.

It is a still other object of the present invention to provide a process for producing the above composite layer AlN-base sinterd body.

Furthermore other objects of the present invention will become apparent in the entire disclosure.

According to a first aspect of the present invention, there is provided:

a composite layer aluminum nitride-base sintered body which comprises:

on at least one surface of AlN-base sintered body a first layer and a second layer in the recited order, said first layer consisting essentially of 100 parts by weight of at least one component selected from the group consisting of W, Mo, borides thereof and carbides thereof as a first component(s), and 0.1–50 parts by weight of a second component consisting essentially of AlN, and said second layer consisting essentially of at least one component selected from the group consisting of W, Mo, borides thereof and carbides thereof.

According to a second aspect of the present invention, there is provided:

a sintered body according to the first aspect, wherein on said second layer, a third layer and a fourth layer are laminated in the recite order, said third layer having a composition which corresponds to the composition of said first layer, and said fourth layer having a composition of said AlN-base body.

According to a third aspect of the present invention, there is provided:

a composite layer aluminum nitride-base sintered body which has been produced by:

applying a composition on an AlN-base material body to form a composite layer material, and sintering said composite layer material under such conditions that AlN is sintered, said composition consisting essentially of 100 parts by weight of at least one component selected from the group consisting of W, Mo, borides thereof and carbides thereof as a first component(s), and 0.1–50 parts by weight of a second component consisting essentially of at least one of AlN and $Al_2O_3$ wherein in the presence of $Al_2O_3$ as the second component $Al_2O_3$ has been converted into AlN after sintering.

According to a fourth aspect of the present invention, there is provided:

a composite layer aluminum nitride-base sintered body which has been produced by:

applying a composition on an AlN-base material body to form a composite layer material, and sintering said composite layer material under such conditions that AlN is sintered, said composition consisting essentially of 100 parts by weight of at least one component selected from the group consisting of W, Mo, borides thereof and carbides thereof as (a) first component(s), 0.1–50 parts by weight of a second component consisting essentially of at least one of AlN and $Al_2O_3$ wherein in the presence of $Al_2O_3$ as the second component $Al_2O_3$ has been converted into AlN after sintering, and 0.1–10 parts by weight of at least one component selected from the group consisting of hydrides of Ti, Zr, Nb, V and Mn, and oxides thereof as a third component(s).

According to a fifth aspect of the present invention, there is provided:

a process for producing a composite layer AlN-base sintered body which comprises following steps:

(a) providing an AlN-base material body (b) forming a first layer on at least one surface of said material body, said first layer consisting essentially of 100 parts by weight of at least one component selected from the group consisting of W, Mo, borides thereof and carbides thereof as a first component(s), and 0.1–50 parts by weight of a second component consisting essentially of AlN, (c) forming a second layer on said first layer to form a laminated body, said second layer consisting essentially of at least one component selected from the group consisting of W, Mo, borides thereof and carbides thereof, and (d) sintering said laminated body under such temperature and condition that AlN is sintered until the density of an AlN-base sintered body reaches at least 90% of the theoretical density.

The fifth aspect is suitably for the production of a multilayer substrate.

According to a sixth aspect of the present invention, there is provided a process for producing a composite layer aluminum nitride-base sintered body which comprises:

applying a surface layer composition on a green AlN-base body, and sintering said surface layer composition simultaneously with said AlN-base body at a temperature in a range of 1500°–2000° C. in a nitrogen-containing non-oxidizing atmosphere, said surface layer consisting essentially of 100 parts by weight of at least one component selected from the group consisting of W, Mo, borides thereof and carbides thereof as a first component(s), and 0.1–50 parts by weight of a second component consisting essentially of at least one of AlN and $Al_2O_3$.

W, Mo, borides thereof or carbides thereof are referred as "conductive component" hereinafter, unless otherwise specified.

According to the first aspect, the second layer is tightly bonded to an AlN-base body through the first layer (intermediate layer).

The second aspect provides a composite layer AlN-base sintered body which is useful for the multilayer substrate.

The third and the fourth aspects provide a composite layer AlN-base sintered body which has been formed by sintering a green AlN-base material body with green surface layer containing a required surface layer-composition on the material body. The third or the fourth aspect provides the same composite layer AlN-base sintered body as that of the second aspect. That is, the fundamental structure according to the third and the fourth aspects provides multilayers. Herein, the green AlN-base body is referred to as "AlN-base material body". The sintering is effected under a condition at which AlN is sintered, wherein a varying compositional distribution is observed from the surface portion to the deeper portion along the depth of the cross section of the surface layer on an AlN-base body. That is, a deeper portion is composed of a distribution layer rich in AlN, while a surface portion (upper portion) is composed of a distribution layer rich in a conductive component. A thin layer having a conductive component as the main component can form the outermost surface. In a preferred case, the surface portion composed substantially of a conductive component can be formed (wherein this surface portion corresponds to the second layer of the first aspect). The compositional distribution from the surface portion to the deeper portion in the coated layer can be controlled by the modification of the surface layer-composition within a limited range.

In the surface layer composition comprising alumina as a second component, alumina is converted to AlN owing to a high affinity to nitrogen present in an atmosphere or neighboring space, so that $Al_2O_3$ does essentially not remain in the surface layer structure of the sintered body. Note this is different from the results obtained by conventional methods.

According to the fourth aspect, a high bonding between the surface layer and the AlN-base sintered body can be formed particularly in single use of AlN as the AlN-base body, in addition to the third aspect.

According to the fifth aspect, the products of the first and the second aspects can be produced.

According to the sixth aspect, the products of the first through the fourth aspects may be produced.

According to each of these aspects, there is provided composite layer AlN-base sintered bodies having a layer which is rich in metal tightly bonded to the base portion of the AlN-base sintered body. This composite layer AlN-base sintered body can be tightly bonded to a metal, which makes it possible to use the composite layer AlN-base sintered bodies having a high heat conductivity and good electric characteristics as the parts of electronic and industrial instruments. It has been difficult to obtain such excellent characteristics in the prior art.

According to the process of the present invention, an AlN-base material body and a surface layer applied on such a material body can be sintered simultaneously, which facilitates the production of a multilayer structure and allows the production of a multilayer base plate (hereinafter referred to as "composite layer substrate") required for electronic instruments. In this case, the production of a multilayer structure has been difficult in the prior art. The bonding between an AlN-base body and the second layer (conductive layer) in a composite layer AlN-base sintered body is improved by a specified laminating of an AlN-base body, the first layer and the second layer. That is, the first layer as an intermediate layer is composed of the first component and the second component, wherein the first component takes part in the bonding formation to the second component takes part in the bonding-formation to a base body comprising the same or similar component.

The layer structure according to the first aspect can be produced by laminating the green materials with the compositions of each layer and sintering the laminated materials simultaneously, or by applying the second aspect or the third aspect. In each of the aspects of the present invention, the surface layer of the product or substrate (the surface layer of the first, the third or the fourth aspect) or the intermediate conductive layer of the second aspect provides in a wide range from conductive to semiconductive layers.

The second layer of the surface layer (single or composite layer) can be formed partially or wholly on the surface of an AlN-base body, wherein the layer formation of a partial area on the entire surface is used for the production of a print circuit.

In producing the multilayer print circuit according to the present invention, the electric conductivity of the said "surface layer" (here, serving as an intermediate layer) is improved by increasing th first component within the above range, and hence the "surface layer" as such is used as an internal circuit of a circuit board. Where the intermediate layer is composed of a conductive layer, the middle portion (interiormost portion) of thickness of the conductive layer is rich in a conductive component, and the both surface portions of this layer is rich in AlN due to the presence of the AlN-substrate layer on the both surfaces of the intermediate layer.

Also, the present invention provides a multilayer laminated base plate in use of AlN, that is, multilayer laminated circuit boards comprising a plurality of AlN substrate-layers and conductive circuit layers interposed therebetween. In this case, the conductive circuit layer is formed by using the composition of the surface layer of the present invention. The production of such multilayer laminated circuit boards has been difficult in the prior art in which metallization is applied to a AlN-base sintered body. This is because the bonding strength is low and hence metallizing-heating treatment is required several times.

According to the teaching of the various aspects of the present invention, this multilayer circuit base substrate can be easily produced, and it has a higher heat-dissipation due to an AlN substrate having a good insulating property and a high thermal coductivity due to a specified circuit layer (or surface) structure.

The AlN-base sintered bodies find a wide range of application. Generally, AlN has numerous industrial uses in which the wettability with metal is needed. In this case, the surface electrical conductivity is not needed specifically. Therefore, it is only required that the outermost surface metal layer has a sufficient wettability with metal. This metal layer includes, for example, a second layer of the first aspect; and the layer having a surface portion rich in metal (compound) component as shown in the third or the fourth aspect. For the above reason, the relative ratio of the first component to the second component is controlled within a range of the present invention.

In the third or the fourth aspect, the amount of the first component can be relatively small (for example, 10–50 parts by weight of second component). Further, the first component may contain a conductive component such as metal boride, etc. as main component, in addition to metal.

The surface of a metallized or metal-rich layer in a composite layer AlN-base sintered body of the present invention can be metal-plated, wherein soldering or brazing is possible through this metal-plated layer. In any cases, soldering-or brazing-bonding strength is sufficiently high, and the bonded layers have a sufficient bonding strength to AlN-base body.

Preferred embodiments of the present invention will be described in the appended dependent claims, and will be disclosed in the following further detailed explanation.

DESCRIPTION OF THE PREFERRED EMBODIMENTS

Figure 1:
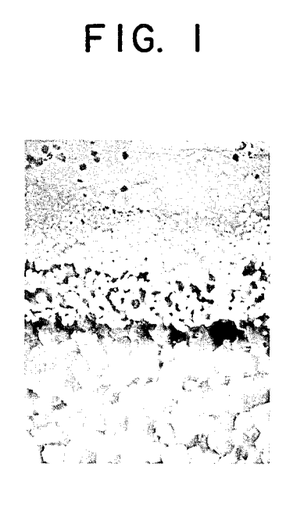
FIG. 1 is electronmicrophotograph which shows a sectional layer structure of an embodiment of the present invention.
Figure 2:
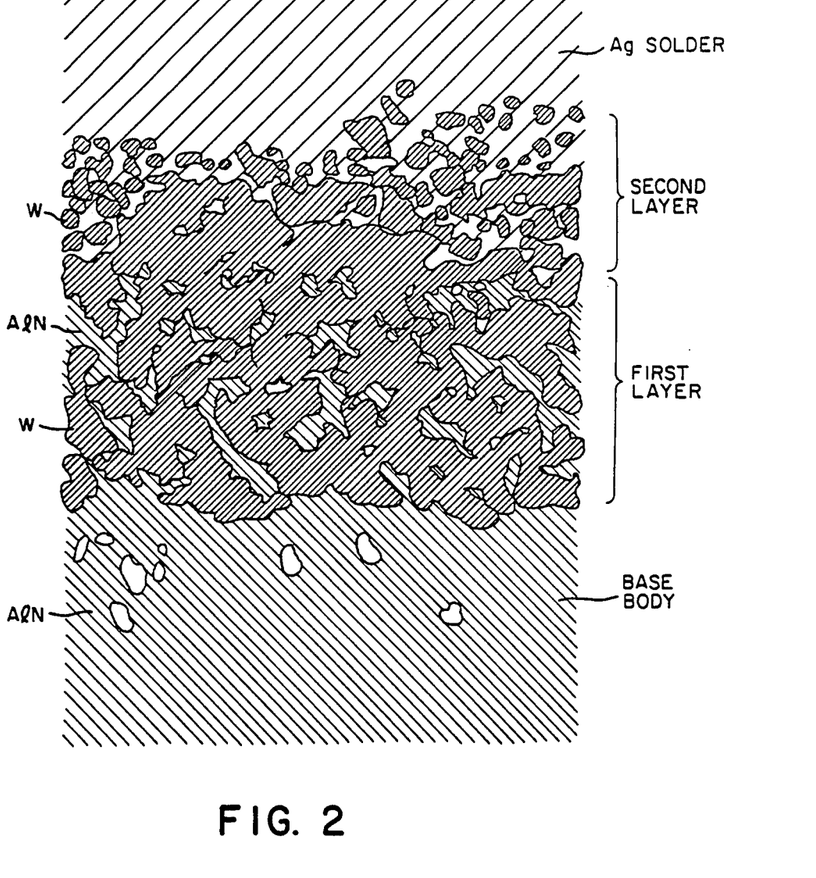
FIG. 2 is a partly enlarged schematic diagram of FIG. 1.

Referring to FIGS. 1 and 2, the bonding between a base body and a first layer, the bonding between a first layer and a second layer, and the bonding between a second layer and a silver soldering are found to be firm and intergral. In this Example, an AlN-base body consists essentially of AlN and 1% by weight of CaO, the first layer consists essentially of W and 20% by weight of the same component as the AlN-base body composition, and the second layer consists essentially of W.

In the above various aspects of the present invention, the amount of the second component mus tbe in the said range, that is, in a range of 0.1–50 parts (unless otherwise specified, "parts" represents parts by weight) relative to 100 parts of the first component.

Below this range, the bonding strength is insufficient between an AlN-base body and a surface layer composed of the surface layer composition. Above this range, the extent of metallization of the surface layer is insufficient due to the deterioration of sinterability of the surface layer.

The amount of the second component is preferably 1–40 parts, more preferably 5–30 parts.

In the above various aspect of the present invention, the AlN-base body or base material can be composed of either AlN alone or in combination of sintering aids as usually used. Such sintering aids include, for example, rare earth metal oxides such as $Y_2O_3$, $CeO$, $La_2O_3$, $Sm_2O_3$, etc., and alkaline earth metal oxides such as CaO, MgO, BaO, BaO, SrO, etc. in order to improve the sinterability. The amount of the sintering aids is approximately 1–5%, preferably 1–3% (unless otherwise specified, "%" represents % by weight). The term "AlN-base sintered body" denotes ones including such sintering aids.

In this connection, it is preferred that the second component contains the same oxide(s) as the above oxide(s) for the more effective achievement of the present invention.

As an AlN-base material body, there can be used powder compact (i.e., sheeted or molded) material body. The use of powder compact material body is advantageous since both the sintering and surface layer formation of an AlN-base material body can be carried out simultaneously. Further, the surface on an AlN-base sintering body can be metallized by using the method and composition of the present invention.

In the first and the second aspects, the thickness of the first layer is preferably at least 0.5 $\mu$m in order to obtain a sufficient bonding between the AlN-base body and the first layer, and it is preferably at most 40 $\mu$m in order to maintain a good electric conductivity of the second layer and prevent the peeling of the first and the second layers from the AlN-base sintered body. The thickness of the first layer is more preferably in a range of 5-35 $\mu$m.

The sum of the thicknesses of the first layer and the second layer is preferably at least 1 $\mu$m in order to obtain a satisfactory air tightness and a sufficient bonding to the AlN-base sintered body, and it is preferably at most 50 $\mu$m in order to prevent peeling, etc. caused by a thermal expansion coefficient difference between the base material and the first layer or the second layer. In this case, the sum of the above thicknesses is more preferably in a range of 5-45 $\mu$m.

Composite layer AlN base sintered bodies in the first and the second aspects are formed simultaneously with the sintering of AlN, for example, after screen-printing the compositions of the first and the second layers on a green sheet composed of AlN as a main component.

Further, it is possible to bond the sintered base body having the surface structure of the present invention to a metal, for example, by nickel-plating on the second layer followed by brazing.

The fourth aspect is carried out based on the third aspect. In this case, there can be contained 0.1-10 parts of at least one component (third component) selected from the group consisting of the hydrides and oxides of Ti, Zr, Nb, V and Mn as the third component, in addition to the first and the second components, wherein a bonding to the AlN-base body is higher. The reason for the formation of such higher bonding is as follows. That is, although $Al_2O_3$ is formed during sintering by the reaction between AlN and oxygen present at the surface of compact the hydrides of Ti, Zr and Mn, and/or oxides thereof react with $Al_2O_3$ to form a spinel, which causes a higher bonding between the AlN-base body and the surface layer. Meanwhile, the hydrides of Nb and V, and/or oxides thereof react with the above $Al_2O_3$ during sintering to form a liquid phase, which causes a higher bonding between the AlN-base body and the surface layer. Particularly, the above effect (an improved bonding strength) is prominent in the case where the AlN-base body is a sintered body consisting of AlN alone. As abovementioned the amount of the third component is in a range of 0.1-10 parts, based on 100 parts of the first components. The the amount of the third component is below the range, the increasing effect of bonding between the AlN-base body and the surface layer is not observed. Meanwhile, if it is above the range, a bonding between the AlN-base body and the surface layer is deteriorated.

In the composite layer AlN-base body in the third aspect, the relative theoretical density is at least 90%, preferably at least 95%, more and most preferably at least 97% and at least 99%. The relative theoretical density of at least 90% is necessary since it provides a higher thermal conductivity than that of an $Al_2O_3$-base material.

The average grain diameter of crystals of the AlN-base sintered body is in a range of 0.5-10 $\mu$m, preferably 0.5-5 $\mu$m, more preferably 2-5 $\mu$m, since the thermal conductivity is too low below the range, and the strength is deteriorated above the range. The average grain size of AlN in the surface layer as sintered is preferably 2 $\mu$m or less, more preferably 1 $\mu$m or less.

The strength of the AlN-base sintered body is at least about 30 kgf/mm$^2$, preferably 30-50 kgf/mm$^2$.

In coating the surface layer composition on the AlN-base material body according to the fourth aspect, there is used a base material body before the sintering, that is, a base material body in a green state. Thereby, the sintering of the base material body can be effected simultaneously with the formation of the surface layer comprising a metallized layer. Note that the green layers will usually contract upon sintering by 30 to 50% from the green state.

As the non-oxidizing atmosphere in sintering, use may be made of nitrogen-containing Ar, nitrogen-containing $NH_3$-decomposition gas, nitrogen-containing $H_2$, or pure nitrogen. The amount of nitrongen in such a non-oxidizing atmosphere should be in such a level that $Al_2O_3$ in the surface layer composition is nitrized to form AlN. Even when the amount of nitrogen is small, for example, below 0.5 vol %, $Al_2O_3$ can be sufficiently nitrized as well by prolonging sintering time. As the starting AlN and $Al_2O_3$ for the paste an average particle size not exceeding 2 $\mu$m is preferred.

It is required that a sintering temperature should be in a range of 1500°-2000° C., as described hereinabove. The sintering of an AlN-base material body is insufficient at a temperature below that range, while aluminum nitride begins to decompose, resulting in a lower wettability between the surface layer and the AlN-base body, at a temperature above that range. The sintering temperature is preferably 1600°-1900° C., more preferably 1700°-1800° C..

The increased amount of W and/or Mo in the surface layer composition within a limited range improves an electrical conductivity of a surface layer or a second layer formed as an intermediate layer, wherein the surface layer as such can be used as internal circuit in the production of a multilayer circuit board (or substrate thereof) of the present invention. The first components as the starting material should be in average particle size 2 $\mu$m or less, more preferably 1 $\mu$m or less.

It is desirable that the surface layer composition of the present invention comprises binder or lubricant in use for compacting (forming or molding) the paste of ceramic powder. Such binder includes, for example, organic binder such as ethyl cellulose, and the like. The solvent of the binder includes, for example, butylcarbitol, acetone, methyl ethyl ketone, toluene, ester and the like.

In applying the surface layer composition of the present invention on the surface followed by sintering, a metal wettable surface layer is formed on the surface. A high bonding between the surface layer and metal can be formed by usual metal plating, such as Ni-plating, to the surface layer followed by brazing. The process after the metal plating is carried out by various techniques the binder being comprised of ethylcellulose, and butylcarbitol for making it pasty, while the 1st component being 1.3 μm in particle size.

TABLE 1

| | | | | Surface Layers | | | | | | | | |
|---|---|---|---|---|---|---|---|---|---|---|---|---|
| | | | | 1st Layer (parts by weight) | | | | | | | | |
| Sample No. | 2nd Layer | First Component | 2nd Component | Amounts of Second Component (parts by weight**) | | | | | | | | |
| | | | | 0 | 0.1 | 1 | 5 | 10 | 20 | 30 | 40 | 50 | 60 |
| 1 | W | W | AlN | <0.5 | 1.2 | 1.8 | 2.5 | 3.1 | 3.5 | 2.6 | 2.0 | 1.5 | <0.5 |
| 2 | W | Mo | AlN | <0.5 | 1.1 | 1.6 | 2.4 | 3.0 | 3.1 | 2.5 | 2.0 | 1.3 | <0.5 |
| 3 | W | W$_2$B | AlN | <0.5 | 1.1 | 1.7 | 2.0 | 2.3 | 2.8 | 2.1 | 2.0 | 1.3 | <0.5 |
| 4 | W | Mo$_2$B | 99% AlN 1% CaO | <0.5 | 1.2 | 1.6 | 2.4 | 3.0 | 3.2 | 2.9 | 2.2 | 1.3 | <0.5 |
| 5 | W | W$_2$C | AlN | <0.5 | 1.1 | 1.5 | 2.2 | 2.7 | 3.1 | 2.2 | 2.1 | 1.2 | <0.5 |
| 6 | W | W | 99% AlN 1% CaO | <0.5 | 1.1 | 1.5 | 2.2 | 2.8 | 3.6 | 3.0 | 2.2 | 1.8 | <0.5 |
| 7 | W | W$_2$B/W$_2$C (1:1) | 99% AlN 1% CaO | <0.5 | 1.3 | 1.8 | 2.7 | 3.3 | 3.8 | 3.0 | 2.3 | 1.5 | <0.5 |

Notes:
The values in Table show peeling strength (kg/mm$^2$).
*100 parts by weight
**parts by weight relative to 100 parts by weight of the first component skilled in the art.

The thermal conductivity of the inventive products is at least 0.14 cal/cm sec °C. (at relative density of 99%) and the peeling strength thereof is at least 1 kgf/mm$^2$. The more preferred embodiments provide the peeling strength of at least 2 kgf/mm$^2$, or 4 kgf/mm$^2$ or more.

It should be understood that following Examples are being presented for better elucidation of the present invention and not for merely limitative purpose, and that any modifications or changes as apparent in the art may be done without departing from the inventive concept.

Unless otherwise indicated, all parts, precents, ratio and the like are by weight.

EXAMPLE 1 (The 1st and the 5th aspects of the present invention)

There were prepared compacts of 30×10×5mm comprising 99% of AlN-powder with 1.0 μm average particle size and 1% of CaO, as AlN-base material bodies. Each of pastes having the composition of the 1st layer shown in Table 1 was screen-printed in 2 mm×2 mm×10 μm (thick) as a first layer on the above compact. Further, each of the pastes having the composition of the 2nd layer shown in Table 1 was screen-printed, in overlapped state, in 2×2 mm×10 μm (thick) as a 2nd layer on the 1st layer. After removing binder, the printed compact was sintered at 1700° C. under 760 Torr for 2 hour in an ammonia-decomposition gas to prepare samples. A Ni-layer was formed in 2-5 μm thick on the surface of the sintered product (substrate) by Ni-electroplating method, and then it was sintered at 850° C. for 10 minutes. Thereafter, an 1×1 mm Kovar (nickel alloy containing both cobalt and iron) plate was brazed at 930° C. for 5 minutes by using a eutectic silver solder, wherein the bonding strength was determined as the peeling strength. The peeling strength is a strength in which the above Kovar plate was peeled from the sintered substrate when a lead wire jointed to the above Kovar-plate was pulled in a direction perpendicular to the adhesion surface at a speed of 0.5 mm/sec.

In the 1st layer of Table 1, the first components show W, Mo, the borides of W and Mo, and the carbides thereof, and the second components show AlN and the same composition as that of an AlN-base body. The pastes include 95% the 1st component and 5% binder, As seen in Table 1 of the Example, it was found that the 1st layer should contain at least one component of W, Mo, the borides thereof, and the carbides thereof (as the first components), as well as 0.1-50 parts of AlN and/or the composition of the AlN-base body (as the second components), based on 100 parts of the first components, for obtaining a useful peeling strength.

EXAMPLE 2 (The 1st aspect of the present invention)

There were prepared compacts of 30×10×5 mm comprising 99% of AlN-powder with 1.0 μm average particle size and 1% of CaO, as the AlN-base material body. A paste containing 20% of the same composition as that of the AlN-base material and the balance being W was screen printed in 2×2 mm area and in thickness as shown in Table 2 as a 1st layer on the above compact. Further, the paste composed of W-powder of 1.3 μm average particle size was screen-printed, in overlapped state, in 2×2 mm×1.0 μm (thick) as a 2nd layer on the 1st layer. After removing binder, the printed compact was sintered in the same procedure as shown in Example 1 to prepare samples.

Further, other samples were prepared in the above manner except that the sum of thicknesses of the 1st and the 2nd layers is as shown in Table 3.

The peeling strength was determined for the above samples.

TABLE 2

| Sample No. | Thickness of 1st layer (μm) | | | | | | | | |
|---|---|---|---|---|---|---|---|---|---|
| | 0 | 0.3 | 0.5 | 1.0 | 10 | 20 | 30 | 40 | 50 |
| 8 | <0.5 | <0.5 | 1.0 | 1.3 | 3.6 | 4.3 | 3.0 | 2.1 | peeling |

The values in Table show peeling strength (kg/mm$^2$)

TABLE 3

| Sample No. | Sum of thicknesses of 1st and 2nd layers (μm) | | | | | | | |
|---|---|---|---|---|---|---|---|---|
| | 0.5 | 1.0 | 10 | 20 | 30 | 40 | 50 | 60 |
| 9 | <0.5 | 1.3 | 2.9 | 3.6 | 4.0 | 3.2 | 1.8 | peeling |

The values in Table show peeling strength (kg/mm$^2$)

As seen in Table 2, it was found that the thickness of the 1st layer should be in a range of 0.5-40 μm for obtaining a sufficient adhesive strength.

Further, as seen in Table 3, it was found that the sum of thicknesses of the 1st and the 2nd layers should be 1–50 μm for preventing peeling.

and the adhesion strength between the Kovar plate and the sintered substrate was determined as peeling strength.

TABLE 4

| | | Surface layer composition | | | | | | | | | | |
|---|---|---|---|---|---|---|---|---|---|---|---|---|
| Sample No. | Base body | 1st component | 2nd Component | \multicolumn{9}{c}{Amounts of 2nd component (parts by weight)} | | | | | | | | |
| | | | | 0 | 0.1 | 1 | 5 | 10 | 20 | 30 | 40 | 50 | 60 |
| 10 | 99% AlN + 1% $Y_2O_3$ | W | AlN | <0.5 | 1.0 | 1.7 | 2.7 | 3.3 | 3.5 | 3.1 | 2.3 | 1.8 | <0.5 |
| 11 | 99% AlN + 1% CaO | W | AlN | <0.5 | 1.2 | 1.9 | 2.5 | 3.5 | 3.1 | 2.5 | 2.1 | 1.3 | <0.5 |
| 12 | AlN | W | AlN | <0.5 | 1.0 | 1.3 | 1.5 | 1.8 | 1.8 | 1.3 | 1.1 | 1.0 | <0.5 |
| 13 | 99% AlN + 1% CaO | W | 99% AlN + 1% CaO | <0.5 | 1.2 | 1.8 | 2.8 | 3.6 | 3.8 | 2.7 | 2.0 | 1.2 | <0.5 |
| 14 | 99% AlN + 1% CaO | Mo | 99% AlN + 1% CaO | <0.5 | 1.3 | 2.0 | 2.4 | 3.5 | 3.0 | 2.3 | 1.9 | 1.2 | <0.5 |
| 15 | 99% AlN + 1% CaO | $W_2B$ | 99% AlN + 1% CaO | <0.5 | 1.1 | 1.5 | 2.3 | 3.0 | 2.5 | 2.1 | 1.6 | 1.1 | <0.5 |
| 16 | 99% AlN + 1% CaO | $Mo_2B$ | 99% AlN + 1% CaO | <0.5 | 1.2 | 1.5 | 2.4 | 3.2 | 2.5 | 2.0 | 1.4 | 1.0 | <0.5 |
| 17 | 99% AlN + 1% CaO | $W_2C$ | 99% AlN + 1% CaO | <0.5 | 1.1 | 1.4 | 2.4 | 2.9 | 2.8 | 2.2 | 1.5 | 1.0 | <0.5 |
| 18 | 99% AlN + 1% CaO | $Mo_2C$ | 99% AlN + 1% CaO | <0.5 | 1.2 | 1.3 | 2.1 | 3.0 | 2.6 | 2.0 | 1.5 | 1.1 | <0.5 |

Note:
The values in Table show peeling strength (kg/mm$^2$).

Furthermore, it was found that the multilayer base plate in the 5th aspect is easily produced by following the procedure in this Example. That is, the 1st layer was laminated on the 2nd layer, on which an AlN-body material layer was laminated. The laminated material was sintered. In this manner, there was prepared a multilayer unit which has an intermediate layer of the 2nd layer having a high conductivity. Also, the obtained multilayer units can be further laminated.

EXAMPLE 3 (The 3rd aspect of the present invention)

As shown in Table 4, 100 parts of the first component and 0–60 parts of the second component wet-milled in acetone to prepare a powder. 5 parts of ethyl cellulose and 30 parts of butylcarbitol were added to the milled powder, and the acetone was volatilized to obtain a surface layer composition. The obtained composition was screen-printed in 2×2 mm×20 μm (thick) on a green sheet (material body) having each composition shown in Table 4, and then dried. After removing the binder, the dried products (substrate) were sintered at 1700° C. under 760 Torr for 1 hour in a nitrogen-gas atmosphere to prepare samples.

By following the procedure of Example 1, Ni-electroplating, brazing and adhesion of the Kovar plate were effected on the surface of the sintered substrate, From Table 4, it was found that the 1st layer should contain at least one component of W, Mo, the borides thereof and the carbides thereof (as the first components), as well as 0.1–50 parts of at least one component of AlN and the same composition as an AlN-base body material (as the second components) for obtaining a sufficient peeling strength.

EXAMPLE 4 (The 4th aspect of the present invention)

The third components were further added in various amount shown in Table 5 to materials. Samples and surface layers were produced by following the procedure of Example 3. Then, the peeling strength was measured by following the procedure of Example 1. Generally, each of the 1st and the 2nd layers contains 100 parts of W and 5 parts of AlN, in all the samples.

TABLE 5

| | | Surface layer composition | | | | | | | |
|---|---|---|---|---|---|---|---|---|---|
| Sample No. | Base body | 1st + 2nd Component (parts by wt) | \multicolumn{7}{c}{Third Component} | | | | | | |
| | | | Composition | \multicolumn{6}{c}{Amounts (parts by weight)} | | | | | |
| | | | | 0 | 0.1 | 1 | 3 | 5 | 10 | 15 |
| 19 | AlN | 100 W + 5 AlN | $TiH_2$ | 1.5 | 1.8 | 2.1 | 2.5 | 3.8 | 1.8 | <0.5 |
| 20 | 99% AlN + 1% CaO | 100 W + 5 AlN | $TiH_2$ | 1.5 | 1.9 | 2.3 | 2.7 | 3.1 | 1.7 | <0.5 |
| 21 | 99% AlN + 1% $Y_2O_3$ | 100 W + 5 AlN | $TiH_2$ | 1.5 | 1.9 | 2.4 | 2.6 | 2.8 | 1.7 | <0.5 |
| 22 | AlN | 100 W + 5 AlN | $Nb_2O_3$ | 1.5 | 1.7 | 2.2 | 2.7 | 3.1 | 1.6 | <0.5 |
| 23 | AlN | 100 W + 5 AlN | $V_2O_3$ | 1.5 | 1.8 | 2.3 | 2.5 | 2.8 | 1.7 | <0.5 |
| 24 | AlN | 100 W + 5 AlN | MnO | 1.5 | 1.7 | 2.1 | 2.6 | 3.0 | 1.7 | <0.5 |
| 25 | AlN | 100 W + 5 AlN | $ZrH_2$ | 1.5 | 1.6 | 2.0 | 2.4 | 2.5 | 1.8 | <0.5 |
| 26 | AlN | 100 W + 5 AlN | $ZrO_2$ | 1.5 | 1.6 | 1.8 | 2.0 | 1.9 | 1.5 | <0.5 |

Note:
The values in Table show peeling strength (kg/mm$^2$).

From Table 5, it was found that when the surface layer composition of this Example contains 0.1–10 parts of at least one component of hydrides of Ti, Zr, Nb, V, and Mn, and oxides thereof, in addition to the composition of Example 3, this Example has a much higher peeling strength than the samples of Example 3 containing only the first and second components.

EXAMPLE 5 (The 6th aspect of the present invention)

Various amounts of $Al_2O_3$ (as the second component) shown in Table 6 were mixed with 100 parts of the first components of Table 6 to prepare admixtures. Each of the admixtures was wet-milled in acetone, and 5 parts of ethyl cellulose and 30 parts of butylcarbitol were added to the milled admixture. By volatization of acetone a surface layer composition was obtained. The surface layer composition was coated in 2×2 mm×20 μm (thick) on the base body shown in Table 6, and then dried. After removing the binder, the coated base body was sintered under normal pressure in a nitrogen atmosphere, at each various temperature shown in Table 6, to prepare samples.

By following the procedure of Example 1, Ni-electroplating, brazing and adhesion of the Kovar plate were carried out in the sintered substrate (sintered product), wherein the adhesion strength between the Kovar plate and the sintered substrate was determined as the peeling strength.

From Table 7, it was found that in case of Sample No. 38 sintered in $H_2$-atmosphere (without nitrogen), the peeling strength is low and $Al_2O_3$ as such remains after sintering. Therefore, it is required that the non-oxidizing atmosphere in sintering should contain nitrogen gas for converting $Al_2O_3$ in the surface layer to AlN and for obtaining a useful peeling strength.

It should be noted that modifications may be made without departing from the gist of the present invention as disclosed herein and claimed.

What is claimed is:

1. A process for producing a composite layer AlN-base sintered body which comprises following steps:
   (a) providing an AlN-base material body
   (b) forming a first layer on at least one surface of said material body,
   said first layer consisting essentially of 100 parts by weight of at least one first component selected from the group consisting of W, Mo, borides thereof and carbides thereof, and
   0.1–50 parts by weight of a second component con-

TABLE 6

| Sample No. | Sintering Temperature (°C.) | Base Body | Surface layer composition First Component 100 parts by weight | Second component: $Al_2O_3$ (parts by weight) | | | | | | | | |
|---|---|---|---|---|---|---|---|---|---|---|---|---|
| | | | | 0 | 0.1 | 1 | 5 | 10 | 20 | 30 | 40 | 50 | 60 |
| 27 | 1700 | 99% AlN + 1% $Y_2O_3$ | W | <0.5 | 1.1 | 1.9 | 3.8 | 3.5 | 3.1 | 2.3 | 2.0 | 1.3 | <0.5 |
| 28 | 1700 | 99% AlN + 1% CaO | W | <0.5 | 1.3 | 1.8 | 5.3 | 4.3 | 3.8 | 2.5 | 2.1 | 1.2 | <0.5 |
| 29 | 1700 | 99% AlN + 1% CaO | Mo | <0.5 | 1.1 | 1.6 | 4.2 | 4.5 | 4.1 | 2.3 | 2.0 | 1.4 | <0.5 |
| 30 | 1700 | 99% AlN + 1% CaO | $W_2B$ | <0.5 | 1.2 | 2.0 | 3.5 | 3.8 | 3.2 | 2.5 | 1.8 | 1.3 | <0.5 |
| 31 | 1700 | 99% AlN + 1% CaO | $Mo_2B$ | <0.5 | 1.3 | 1.9 | 3.3 | 3.5 | 3.1 | 2.3 | 1.6 | 1.2 | <0.5 |
| 32 | 1700 | 99% AlN + 1% CaO | $W_2C$ | <0.5 | 1.1 | 1.5 | 2.9 | 3.3 | 2.7 | 2.2 | 1.4 | 1.2 | <0.5 |
| 33 | 1700 | 99% AlN + 1% CaO | $Mo_2C$ | <0.5 | 1.2 | 1.8 | 3.0 | 3.1 | 2.9 | 2.3 | 1.3 | 1.1 | <0.5 |
| 34 | 1400 | 99% AlN + 1% CaO | W | —** | — | — | — | — | — | — | — | — | — |
| 35 | 1500 | 99% AlN + 1% CaO | W | <0.5 | 1.0 | 1.0 | 1.2 | 1.5 | 1.3 | 1.1 | 1.0 | 1.0 | <0.5 |
| 36 | 2000 | 99% AlN + 1% CaO | W | <0.5 | 1.0 | 1.1 | 1.3 | 1.9 | 1.4 | 1.1 | 1.0 | 1.0 | <0.5 |
| 37 | 2100 | 99% AlN + 1% CaO | W | — | — | — | — | — | — | — | — | — | — |

Note:
*The Values in Table show peeling strength (kg/mm$^2$).
**"—" in Table show "not measurable".

As seen in Table 6, it was found that the surface layer composition should contain 0.1–50 parts of $Al_2O_3$ (as the scond component) for obtaining a useful peeling strength. Further, it was found that the sintering temperature should be in a range of 1500°–2000° C. for sintering an AlN-base material body sufficiently and for obtaining a useful peeling strength. It was identified by an X-ray diffraction method that $Al_2O_3$ in the surface layer shown in Table 6 was entirely converted into AlN.

EXAMPLE 6 (The 3rd aspect of the present invention)

The base materials body and the surface layer compositions in Table 7 were sintered at 1700° C. in various atmospheres shown in Table 7 to prepare samples. By following the procedure of Example 5, peeling strength was measured.

Further, the conversion of $Al_2O_3$ to AlN was determined by the X-ray diffraction method. As the results of X-ray diffraction analysis, main components were shown in Table 7.

(c) forming a second layer on said first layer to form a laminated body,
   said second layer consisting essentially of at least one component selected from the group consisting of W, Mo, borides thereof and carbides thereof, and
   (d) sintering said laminated body under such temperature and condition that AlN is sintered until the density of an AlN-base sintered body reaches at least 90% of the theoretical density.

2. A process for producing a composite layer aluminum nitride-base sintered body which comprises:
   applying a surface layer composition on a green AlN-base body, and
   sintering said surface layer composition simultaneously with said AlN-base body at a temperature in a range of 1500°–2000° C. in a nitrogen-containing non-oxidizing atmosphere,
   said surface layer consisting essentially of 100 parts by weight of at least one first component selected

TABLE 7

| Sample No. | Sintering atmosphere | Base body | Surface layer composition | | Peeling strength (kg/mm$^2$) | X-ray diffraction analysis |
|---|---|---|---|---|---|---|
| | | | 1st component (100% by weight) | 2nd component (% by weight) | | |
| 38 | $H_2$ | 99% AlN—1% CaO | W | 10 | <0.5 | $Al_2O_3$ |
| 39 | $H_2$ + 5 vol % $N_2$ | 99% AlN—1% CaO | W | 10 | 3.5 | AlN |
| 40 | $N_2$ | 99% AlN—1% CaO | W | 10 | 4.3 | AlN | from the group consisting of W, Mo, borides thereof and carbides thereof, and 0.1–50 parts by weight of a second component consisting essentially of at least one of AlN and $Al_2O_3$.

3. The process according to claim 1, wherein the process further comprises the following steps performed before said step (d):

(e) forming a third layer on the free surface of said second layer, said third layer consisting essentially of the same components of said first layer, and (f) forming a fourth layer on the free surface of said third layer, said fourth layer consisting of the same material as said AlN-base material body.

4. The process according to claim 3, wherein the process further comprises performing the following steps before said step (d):

(g) performing the same step as said step (b) on the free surface of said fourth layer, and (h) performing the same step as said step (c).

5. The process according to claim 3, wherein a process comprises:

applying at least one cycle of said steps (b), (c), (e) and (f) in the recited order before said step (d).

6. The process according to claim 1 or 2, wherein at least one of said body material and said second component further contains a sintering aid.

7. The process according to claim 6, wherein the sintering aid is at least one selected from alkaline earth metal oxides and rare earth metal oxides.

8. The process according to claim 7, wherein the sintering aid is at least one selected from the group consisting of CaO, MgO, BaO, SrO, $Y_2O_3$, CeO, $La_2O_3$ and $Sm_2O_3$.

9. The process according to claim 2, wherein said sintering is effected at a temperature ranging from 1600° to 1900° C..

10. The process according to claim 2, wherein said surface layer composition further comprises 0.1–10 parts by weight of at least one third component selected from the group consisting of hydrides of Ti, Zr, Nb, V and Mn, and oxides thereof.

11. The process according to claim 2, wherein said nitrogen-containing non-oxidizing atmosphere is at least one of nitrogen and an ammonia-decomposition gas or a mixture of argon and at least one of nitrogen and an ammonia-decomposition gas.

12. A composite layer aluminum nitride-base sintered body which has been produced by:

applying a composition on an AlN-base material body to form a composite layer material, and sintering said composite layer material under such conditions that AlN is sintered, said composition consisting essentially of 100 parts by weight of at least one first component selected from the group consisting of W, Mo, borides thereof and carbides thereof and 0.1–50 parts by weight of a second component consisting essentially of at least one of AlN and $Al_2O_3$ wherein in the presence of $Al_2O_3$ as the second component $Al_2O_3$ has been converted into AlN after sintering.

13. A composite layer aluminum nitride-base sintered body which has been produced by:

applying a composition on an AlN-base material body to form a composite layer material, and sintering said composite layer material under such conditions that AlN is sintered, said composition consisting essentially of 100 parts by weight of at least one first component selected from the group consisting of W, Mo, borides thereof and carbides thereof, 0.1–50 parts by weight of a second component consisting essentially of at least one of AlN and $Al_2O_3$ wherein in the presence of $Al_2O_3$ as the second component $Al_2O_3$ has been converted into AlN after sintering, and 0.1–10 parts by weight of at least one third component selected from the group consisting of hydrides of Ti, Zr, Nb, V and Mn, and oxides thereof.

14. The sintered body according to claim 12 or 13, wherein at least one of said AlN-base body and said second component further contains a sintering aid.

15. The sintered body according to claim 14, wherein the sintering aid is at least one selected from alkaline earth metal oxides and rare earth metal oxides.

16. The sintered body according to claim 15, wherein the sintering aid is at least one selected from the group consisting of CaO, MgO, BaO, SrO, $Y_2O_3$, CeO, $La_2O_3$ and $Sm_2O_3$.

* * * * *